(12) United States Patent
Cowen et al.

(10) Patent No.: US 6,395,435 B1
(45) Date of Patent: May 28, 2002

(54) PHOTO-LITHOGRAPHIC MASK HAVING TOTAL INTERNAL REFLECTIVE SURFACES

(75) Inventors: Steven J. Cowen; Michael A. Kagan, both of San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/605,036

(22) Filed: Jun. 27, 2000

(51) Int. Cl.[7] .................................................. G03F 9/00
(52) U.S. Cl. ............................................................ 430/5
(58) Field of Search ............................... 430/5, 322, 323, 430/324; 716/19, 21; 216/41, 44

(56) References Cited

U.S. PATENT DOCUMENTS

| | | |
|---|---|---|
| 5,208,125 A | 5/1993 | Lowrey et al. |
| 5,276,551 A | 1/1994 | Nakagawa |
| 5,403,685 A | 4/1995 | Vidusek et al. |
| 5,756,237 A * | 5/1998 | Isao ............................. 430/5 |
| 5,817,242 A * | 10/1998 | Biebuyck et al. ............. 216/41 |
| 5,902,702 A | 5/1999 | Nakao et al. |
| 5,928,815 A | 7/1999 | Martin |
| 5,989,755 A | 11/1999 | Shoki |
| 6,010,807 A | 1/2000 | Lin |
| 6,017,659 A | 1/2000 | Lee et al. |
| 6,051,345 A | 4/2000 | Huang |
| 6,057,063 A | 5/2000 | Liebermann et al. |

OTHER PUBLICATIONS

"'Light stamps'could simplify optical lithography", *ZRL Research News*, Jul. 15, 1998, 4 pages, Zurich, Switzerland.

* cited by examiner

*Primary Examiner*—S. Rosasco
(74) *Attorney, Agent, or Firm*—Harvey Fendelman; Peter A. Lipovsky; Michael A. Kagan

(57) ABSTRACT

A photo-lithographic mask includes a flexible, optically transparent body having an optically transmissive first surface for receiving an optical signal, and a second surface opposite the first surface having grooves for internally reflecting first portions of the optical signal and for allowing second portions of the optical signal to be transmitted through the second surface when the second surface is pressed against a wafer. The body consists essentially of silicone. The grooves have a saw tooth profile that are configured at an angle that exceeds the critical angle of the silicone with respect to the direction of the incoming optical signal.

7 Claims, 2 Drawing Sheets

PHOTO-LITHOGRAPHIC MASK HAVING TOTAL INTERNAL REFLECTIVE SURFACES

BACKGROUND OF THE INVENTION

The present invention generally relates to the field of photolithography, and more specifically relates to a photo lithographic mask made of a flexible, transparent material and having internally reflective optical interfaces that reflect a portion of an excitation optical signal and regions through which light may propagate for imparting a pattern in a photo resist layer formed on a silicon wafer.

The circuit-on-a-chip industry has been characterized since its inception in the 1960s by the production of chips having ever higher device densities. High densities demand high precision in the laying out of the devices and their interconnections on the semiconductor chip. As the densities have increased, so has the degree of precision demanded. For many years, the dominant response to these demands has been to use photo resist-based lithography. Lithography involves exposing an image of the circuit in a photo resist layer formed on a silicon wafer by shining ultraviolet (UV) light on the photo resist through a masking device having slits that form a desired pattern. Subsequent steps in the fabrication process then depend on those portions of the photo resist that had been illuminated having different physical and chemical properties than those portions that had not been illuminated. As a general proposition it can be noted that manufacturing efficiency is improved by investing the effort required to produce a mask and then using that mask to produce large numbers of chips. The more chips that can be manufactured using a given mask, the more industry can afford to invest in a particular mask. Because of this, techniques are available for forming the patterns on the mask that would be impractical if applied directly to the individual chips.

One type of recently developed mask is made of a flexible material that is placed in direct contact with a photo resist layer formed on a silicon wafer. An important advantage of a "direct contact" mask is that the need for expensive focusing optics is obviated. The mask includes opaque regions defined by an opaque layer typically formed using ink and optically transparent regions which collectively define a mask pattern. When light is directed through the mask, some light is occluded by the opaque regions and other light is allowed to propagate through the mask. Only photo resist exposed to the light is developed. In this way, the mask pattern is replicated in the photo resist layer. One limitation of such a mask is that the occluded light is absorbed as heat energy by the mask material. The amount of energy absorbed by the mask in a given time period must be less than that which would damage the mask material, thereby placing a limit on the intensity of the light directed through the mask, thereby limiting the rate at which microcircuits may be manufactured. Another disadvantage of the occluding layer is its vulnerability to forming pinholes due to mechanical flexure and from optical damage induced from irradiation from intense optical sources such as a laser. A need therefore exists for a mask which is less sensitive to the thermal limits of the mask material, and to pinhole damage.

SUMMARY OF THE INVENTION

The present invention provides a photo-lithographic mask which includes a flexible, optically transparent body having an optically transmissive first surface for receiving an optical signal, and a second surface opposite the first surface having grooves for internally reflecting first portions of the optical signal and for allowing second portions of the optical signal to be transmitted through the second surface when the second surface is pressed against a wafer. The body consists essentially of silicone. The grooves have a saw tooth profile that are configured at an angle that exceeds the critical angle of the silicone-to-air interface with respect to the direction of the incoming optical signal.

In a second embodiment of the invention, a photo-lithographic mask includes a flexible, optically transparent body having an optically transmissive first surface for receiving an optical signal, and a second surface opposite the first surface. The second surface has grooves for internally reflecting first portions of the optical signal and contact areas generally parallel to the first surface for allowing second portions of the optical signal to be transmitted through the second surface.

An important advantage of the invention is that optical energy that is not required to expose photo resist, is reflected back out of the element so that the element does not suffer damage from absorbing excessive heat energy. Another advantage of the invention is that it obviates the need for applying an ink or occluding layer as a light blocking mechanism. These and other advantages of the invention will become more apparent upon review of the accompanying drawings and specification, including the claims.

BRIEF DESCRIPTION OF THE DRAWINGS

Throughout the several view, like elements are referenced using like references.

DESCRIPTION OF THE PREFERRED EMBODIMENT

The present invention is directed to a photo lithographic pattern mask having regions that provide total internal optically reflective interfaces and other regions through which light may be propagated so that collectively, the mask pattern may be imparted into a photo resist layer formed on a silicon wafer. The process by which this is done is known as photolithography. The mask, when pressed against the photo resist layer of a wafer and irradiated with optical energy having an appropriate wavelength, transfers the mask pattern onto the photo resist layer. However, optical energy is prevented from exposing particular regions of the photo resist layer by surfaces of the mask that are oriented at an angle greater than the critical angle for the mask material with respect to an axis normal to the incident surface of the mask. This technique has advantages compared with applying a film of absorbing ink to the regions of the mask which are intended to block light.

Figure 1:
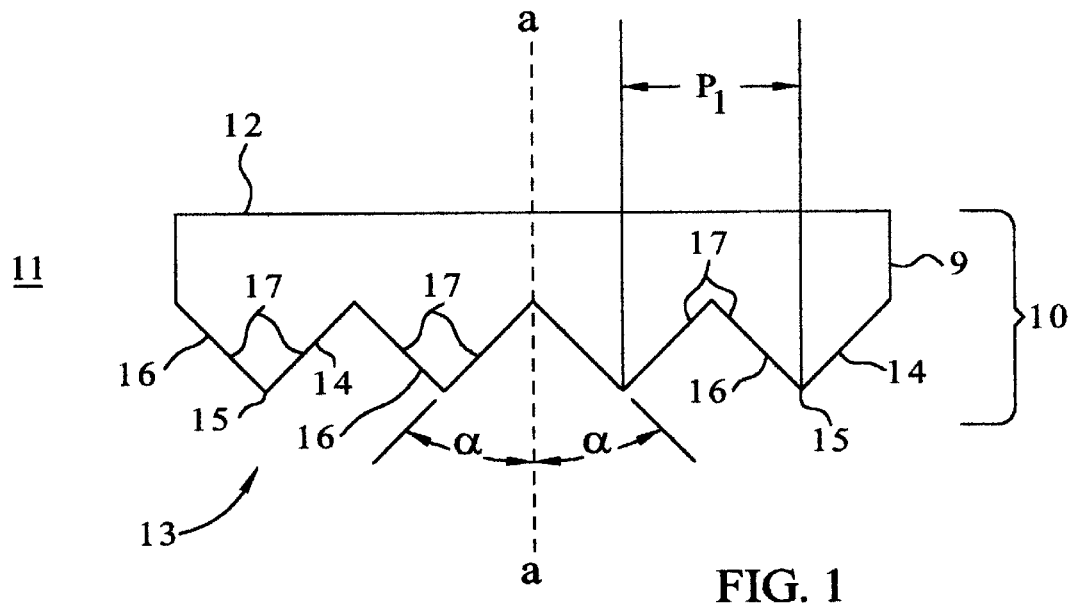
FIG. 1 is an elevation view of a mask embodying various features of the present invention.
Figure 2:
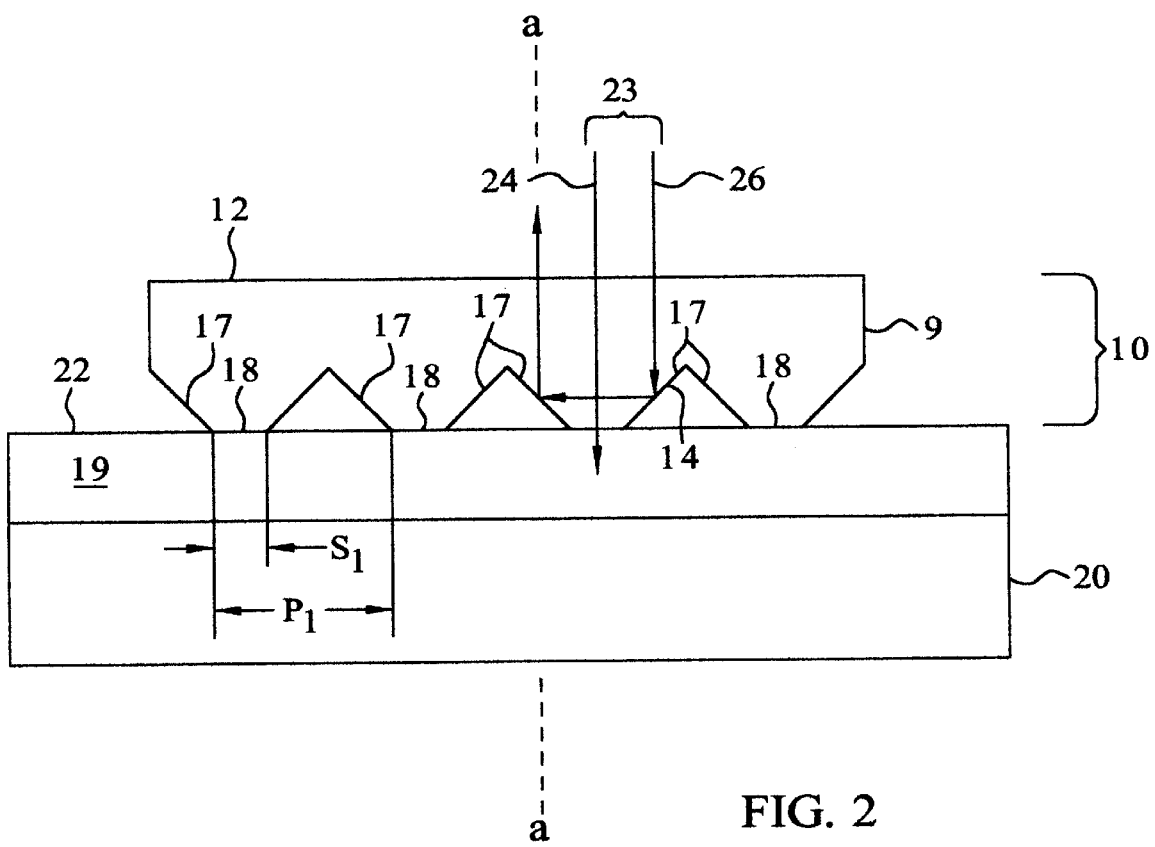
FIG. 2 shows the mask of FIG. 1 pressed against a wafer.

Referring to FIGS. 1 and 2, there is shown a photo-lithographic mask 10 that is both flexible and optically transparent. Mask 10 has a body 9 made of an optically transparent and resilient material such as silicone. Silicone has several desirable physical properties which make it particularly suitable for use as a photo lithographic mask, including flexibility, good thermal resistance over a wide temperature range, transparency, and chemical resistance. An example of one particular type of silicone suitable for use in the present invention is Sylgard® 184. Body 9 has a generally flat optically transmissive surface 12 and a grooved surface 14 opposite flat surface 12. When body 9 is in a relaxed state, surface 14 includes multiple angled surfaces or facets 16 and 14 that are coterminous along lines 15, thereby collectively providing surface 14 with a saw tooth profile when body 9 is in a relaxed state. By way of example, the distance $p_1$ between lines 15 may be on the order of about 100 nm or more (millionths of a millimeter).

Surfaces 14 and 16 are oriented at an angle a with respect to axis a—a, where $\alpha > \beta_c$, and $\beta_c$ represents the critical angle of the material comprising body 9. From basic optics, $\beta_c = \arcsin(n_1/n_2)$, where $n_1$ is the index of refraction of the material comprising body 9 and $n_2$ is the index of refraction of the medium 11, such as air, adjacent to surface 14. Silicone has an index of refraction of 1.414 and air has an index of refraction of about 1.000. Therefore, if body 9 is made of silicone, and mask 10 is used in an atmospheric environment 11, then $\beta_c = \arcsin(1.414/1.00)=1.414$, or $\beta_c=45°$, and $\alpha>45°$.

The operation of the invention relies on the well known optical phenomenon whereby light incident on a surface at the critical angle for the material and an adjacent medium is refracted substantially parallel to the interface within the medium. At angles that exceed the critical angle, total internal reflection can occur when light propagates from a high refractive index medium into a low refractive index medium at non-normal incidence. At the critical angle, the light is exactly parallel to the interface. At angles exceeding the critical angle, the interface becomes a loss less mirror, reflecting the light ray with an angle of incidence equal to the angle of refraction.

The operation of mask 10 is described with reference to FIG. 2. When mask 10 is pressed against photo resist layer 19 formed on silicon wafer 20, body 9 is compressed so that very narrow regions of surfaces 14 and 16 adjacent along lines 15 are compressed to form contact areas 18 in intimate contact with photo resist layer 19. An optical signal 23 comprised of light rays 24 and 26, such as UV light is directed into body 9 through surface 12. Optical signal 23 propagates through body 9 in a direction normal to surface 12 (parallel to axis a—a). However, light ray 23 exits body 9 via contact area 18, and then irradiates and develops photo resist layer 19. Light ray 26 enters body 9 through surface 12, but is reflected by interfaces 17 so that light ray 26 exits body 9 through surface 12. Each of interfaces 17 is the inside of body 9 immediately bounded by either of surfaces 14 or 16. Where contact areas 18 are pressed against photo resist layer 19, light ray 24 propagates through the contact area and exposes the photo resist layer 19. Because mask 10 is in intimate contact with the photoresist layer applied to the silicon wafer 20, even if the width of contact region 18 is as small as a half wavelength of the optical signal in the silicone 23, diffraction will not cause too much spreading within the photo resist layer. Therefore, it may be appreciated that mask 10 may impart a pattern having very fine resolution on the order of ½ wavelength of light divided by the refractive index of silicone into photoresist layer 19 with practically no optical energy absorption by body 9. By way of example, the width, $s_1$ of contact area 18 may be on the order of about 100 nm (millionths of a millimeter) when a 248 nm laser is employed for illumination and the minimum periodicity $p_1$ of the resulting pattern may be on the order of about 200 nm.

Figure 3:
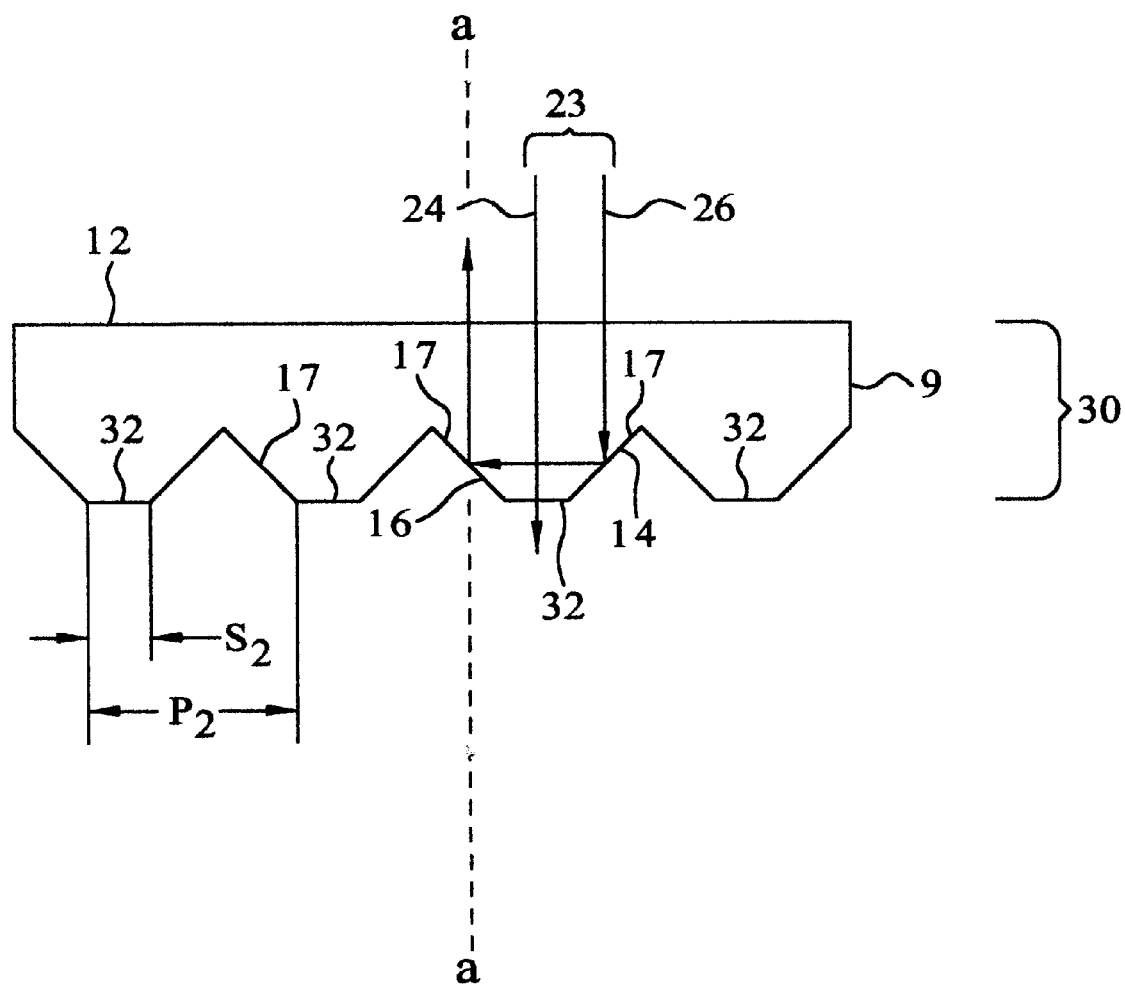
FIG. 3 is an elevation view of a second embodiment of the present invention.

Another embodiment of the invention is shown in FIG. 3 which shows a mask 30 having preformed contact areas 32 in place of coterminous lines 15. In other words, angular surfaces 14 and 16 each are separated by and coterminous with a contact area 32 when mask 30 is in a relaxed state. Each of contact areas 32 is substantially parallel to surface 12 of mask 30. An important advantage of preformed contact areas 32 is that they would provide less dimensional variability when mask 30 is pressed against photo resist layer 19 compared to that of contact areas 18. When light ray 23 enters body 9 of mask 30 at an angle normal to surface 12 (parallel to axis a—a), light ray 23 penetrates the body and exits through contact area 32. However, when light ray 26 enters body 9 of mask 30 at an angle normal to surface 12, light ray 26 penetrates the body and is reflected by interfaces 17 so that it is directed back out of body 9 through surface 12. By way of example, width, $s_2$ of contact area 32 may be on order of about 100 nm (millionths of a millimeter) or more and the periodicity $p_2$ of contact areas may be on the order of about 200 or more.

The present invention provides important advantages over prior art photo lithographic masks. First, the target may be exposed to light having a higher energy flux than can masks without internally reflective interfaces. The reflected light is minimally absorbed by the body 9, thereby greatly reducing thermal damage to the material comprising the body. The use of higher intensity excitation optical energy permits higher manufacturing throughput rates and opens up new types of applications for flexible masks. For example, the present invention may be used to manufacture optical fiber Bragg gratings. Masks embodying features of the invention can survive more exposure cycles for a given illumination energy flux because there is no occluding layer to absorb energy and transfer heat to the transparent mask material. Further, the manufacture of mask 10 does not require a separate step for fabricating an occluding layer.

Obviously, many modifications and variations of the present invention are possible in light of the above teachings. It is therefore to be understood that within the scope of the appended claims, the invention may be practiced otherwise than as specifically described.

We claim:

1. A photo-lithographic mask, comprising:
a flexible, optically transparent body having an optically transmissive first surface for receiving an optical signal, and a second surface opposite said first surface having grooves for internally reflecting first portions of said optical signal and for allowing second portions of said optical signal to be transmitted through said second surface when said second surface is pressed against a wafer.

2. The photo-lithographic mask of claim 1 wherein said body consists essentially of silicone.

3. The photo-lithographic mask of claim 1 wherein first regions of said grooves have a saw tooth profile.

4. The photo-lithographic mask of claim 1 wherein said second surface includes contact areas generally parallel to said first surface.

5. A photo-lithographic mask, comprising: a flexible, optically transparent body having an optically transmissive first surface for receiving an optical signal, and a second surface opposite said first surface having grooves for internally reflecting first portions of said optical signal and contact areas generally parallel to said first surface for allowing second portions of said optical signal to be transmitted through said second surface.

6. The photo-lithographic mask of claim 5 wherein said body consists essentially of silicone.

7. The photo-lithographic mask of claim 5 wherein first regions of said grooves have a saw tooth profile.

* * * * *